US007003124B1

(12) United States Patent
Thiel

(10) Patent No.: US 7,003,124 B1
(45) Date of Patent: Feb. 21, 2006

(54) SYSTEM AND METHOD FOR ADJUSTING FREQUENCY RESPONSE CHARACTERISTICS OF HIGH-PASS CROSSOVERS SUPPLYING SIGNAL TO SPEAKERS USED WITH SUBWOOFERS

(75) Inventor: James Thiel, Lexington, KY (US)

(73) Assignee: Thiel Audio Products, Lexington, KY (US)

( * ) Notice: Subject to any disclaimer, the term of this patent is extended or adjusted under 35 U.S.C. 154(b) by 895 days.

(21) Appl. No.: 09/838,952

(22) Filed: Apr. 20, 2001

Related U.S. Application Data

(60) Provisional application No. 60/207,792, filed on May 30, 2000.

(51) Int. Cl.
*H03G 5/00* (2006.01)

(52) U.S. Cl. .......................................................... 381/99

(58) Field of Classification Search .................. 381/99, 381/100, 98, 103, 101, 102, 59, 97, 96
See application file for complete search history.

(56) References Cited

U.S. PATENT DOCUMENTS

| | | | | |
|---|---|---|---|---|
| 5,617,480 | A * | 4/1997 | Ballard et al. | 381/98 |
| 5,930,374 | A * | 7/1999 | Werrbach et al. | 381/99 |
| 6,317,117 | B1 * | 11/2001 | Goff | 381/98 |
| 6,405,227 | B1 * | 6/2002 | Prakash | 708/300 |
| 6,606,388 | B1 * | 8/2003 | Townsend et al. | 381/99 |
| 6,674,864 | B1 * | 1/2004 | Kitamura | 381/99 |
| 6,775,385 | B1 * | 8/2004 | Coombs | 381/99 |

* cited by examiner

*Primary Examiner*—Stella Woo
(74) *Attorney, Agent, or Firm*—Thomas, Kayden, Horstemeyer & Risley

(57) ABSTRACT

A system and method for adjusting the frequency response of a main speaker system used in conjunction with a subwoofer by modifying the input signal in response to user-adjustable settings to compensate for main-speaker effects characteristics in order to produce a desirable blend of the subwoofer sonic output and the main-speaker sonic output.

5 Claims, 16 Drawing Sheets

SYSTEM AND METHOD FOR ADJUSTING FREQUENCY RESPONSE CHARACTERISTICS OF HIGH-PASS CROSSOVERS SUPPLYING SIGNAL TO SPEAKERS USED WITH SUBWOOFERS

CROSS REFERENCE TO RELATED APPLICATIONS

This application claims the benefit of U.S. Provisional Patent Application No. 60/207,792; dated May 30, 2000, which is incorporated herein by reference in its entirety.

FIELD OF INVENTION

This invention relates generally to loudspeakers, and more particularly to crossovers used to divide the audio signal between subwoofer speakers and main speakers in a sound reproduction system.

BACKGROUND

As is well known, a loudspeaker receives an electrical signal representing an audio sound, and converts the electrical signal to an audio sound wave via a loudspeaker driver unit. The driver unit comprises, in part, a motor that responds to the electrical signal to move a diaphragm. The movement of the diaphragm perturbs the surrounding air, which causes the audio wave.

Due to inadequate low-frequency characteristics, many loudspeakers do not respond well to input signals of very low frequencies (i.e., the bass or lower register). Thus, a high quality audio system may include a separate, specialized speaker, termed a subwoofer, which is designed to more accurately reproduce the lower frequencies of the full sound spectrum. In some instances, a subwoofer is used in conjunction with a crossover. The crossover separates, with respect to a (usually user-definable) crossover frequency, the full sound spectrum into low-frequency components (i.e., those signals that are below a crossover frequency) and high-frequency components (i.e., those signals that are above a crossover frequency). The crossover then directs the low-frequency components to the subwoofer and the high-frequency components to the main speaker. The crossover's high-pass response is intended to complement the low-pass response characteristics of the subwoofer, hence, achieving a desirable blending of the sonic output of the main speaker and the subwoofer. Although the use of a crossover-subwoofer system provides improved sound quality, further improvements are desired.

SUMMARY

The present invention provides a system and method for accurately reproducing audio sounds by adjusting the high-pass characteristics of a crossover system to account and compensate for the frequency response characteristics of a main speaker.

Briefly described, a user supplies information relating to the low frequency response characteristics of a main speaker to the crossover system by adjusting user-adjustable settings. The crossover system receives an input audio signal and produces a low-pass component and a high-pass component of the input signal. The high-pass component of the signal is generated with respect to the user-adjustable settings. This high-pass component, when cascaded through an amplifier and a main speaker, produces a high-frequency output that, when combined with the low-frequency output of the subwoofer, results in a combined main speaker/subwoofer system with a more desirable sonic output (i.e., a higher quality sound).

In architecture, the system comprises a crossover configured to receive user-adjustable settings, which are indicative of main speaker characteristics. The crossover is further configured to produce a high-frequency signal from the input signal as a function of these user-adjustable settings. This high-frequency signal, when delivered through an amplifier and main speaker, produces a main speaker sonic output that is complementary to the subwoofer's sonic output to produce the desired blending of low-frequency and high-frequency sounds.

In accordance with another aspect of the present invention, a method is provided for adjusting the frequency response of a speaker to produce a desired high-frequency output. The method can be broadly conceptualized as receiving an input signal and user-adjustable settings, and generating a high-pass signal from the input signal as a function of the user adjustable settings. The generated high-pass signal, when cascaded through an amplifier and main speaker, produces a main speaker sonic output that is complementary to the subwoofer's sonic output to produce the desired combined sonic output.

Other systems, methods, features, and advantages of the invention will be or become apparent to one with skill in the art upon examination of the following figures and detailed description. It is intended that all such additional systems, methods, features, and advantages be included within the scope of the invention, and be protected by the accompanying claims.

BRIEF DESCRIPTION OF THE DRAWINGS

The above and further features, advantages, and benefits of the present invention will be apparent upon consideration of the following detailed description, taken in conjunction with the accompanying drawings, in which like reference characters refer to like parts throughout.

DETAILED DESCRIPTION OF DRAWINGS

Figure 1A:
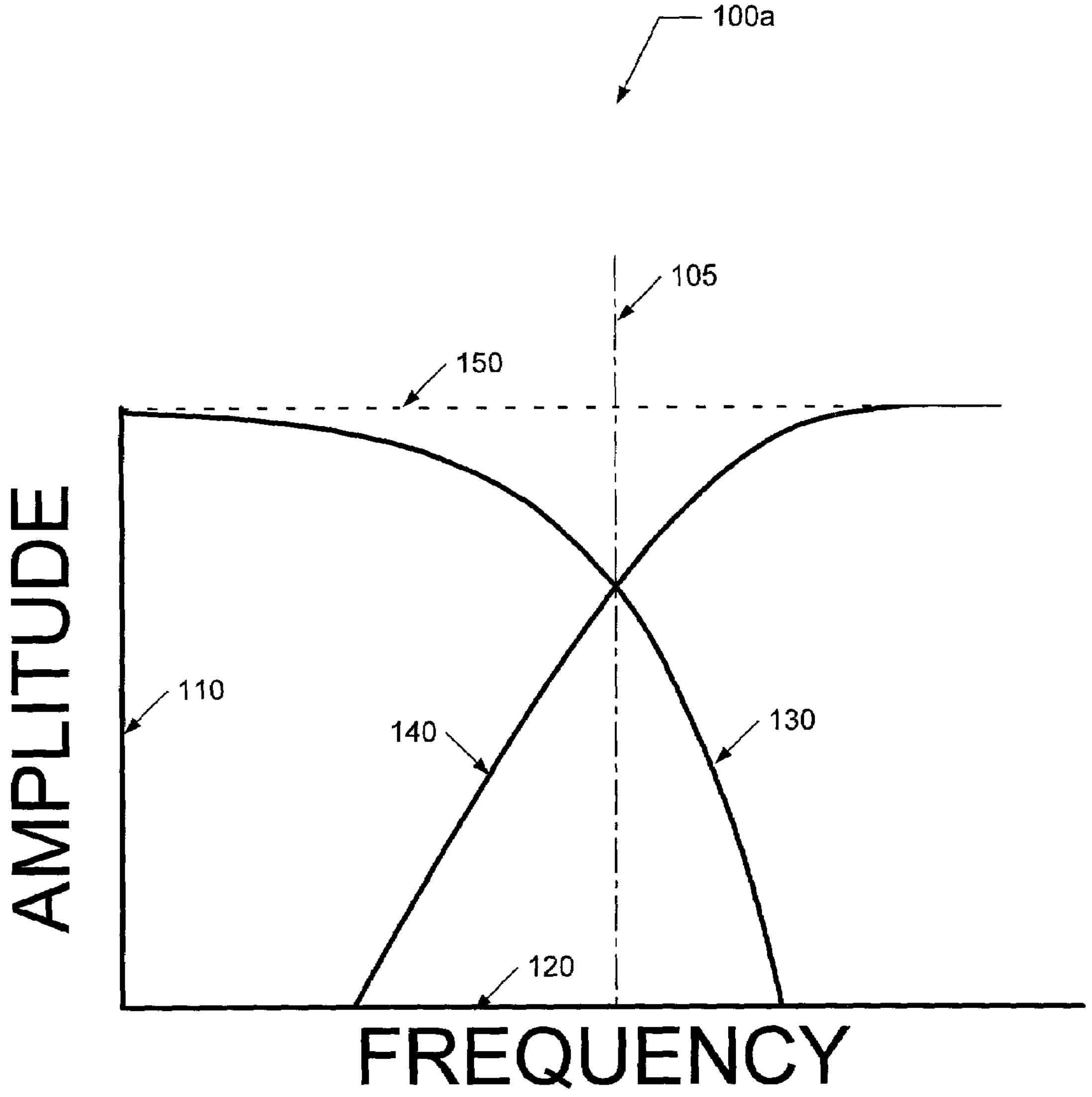
FIG. 1A is a frequency response plot showing an ideal response of a combined speaker and subwoofer system.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications, and equivalents included within the spirit and scope of the invention as defined by the appended claims.

Theory

The normal audible sound spectrum consists of a frequency range from approximately 20 Hz up to approximately 20 kHz. Since speakers in a typical stereo system do not have a uniform frequency response to the lowest parts of the audible sound range, different frequency components of the sound range are handled by different speakers having a desired frequency response for a given frequency range. An example of this is given in FIG. 1A, which is a frequency response plot showing the high-frequency and low-frequency components of a signal. Ideally, a crossover system divides a uniform input signal 150 into a high-frequency response 140 having frequencies above a given crossover frequency 105 and a low-frequency response 130 having frequencies below a given crossover frequency 105. The high-frequency response 140 is amplified through a main speaker amplifier while the low-frequency response 130 is amplified through a subwoofer amplifier. The signal from the main speaker amplifier is then channeled through a main speaker which, ideally, provides sound output identical to the high-frequency response 140 from the crossover system. Similarly, the signal from the subwoofer amplifier is channeled through a subwoofer which, ideally, provides sound output identical to the low-frequency response 130 from the crossover system. In other words, in an ideal system, the low-frequency response 130 and the high-frequency response 140 of the crossover system would pass through the main speaker and subwoofer undistorted, thereby producing a low-frequency response and a high-frequency response that accurately represents of the high-frequency response 140 and the low-frequency response 130 from the crossover system. Hence, the ideal combined response from the main speaker and the subwoofer would be an accurate representation of the uniform input signal 150.

Figure 1B:
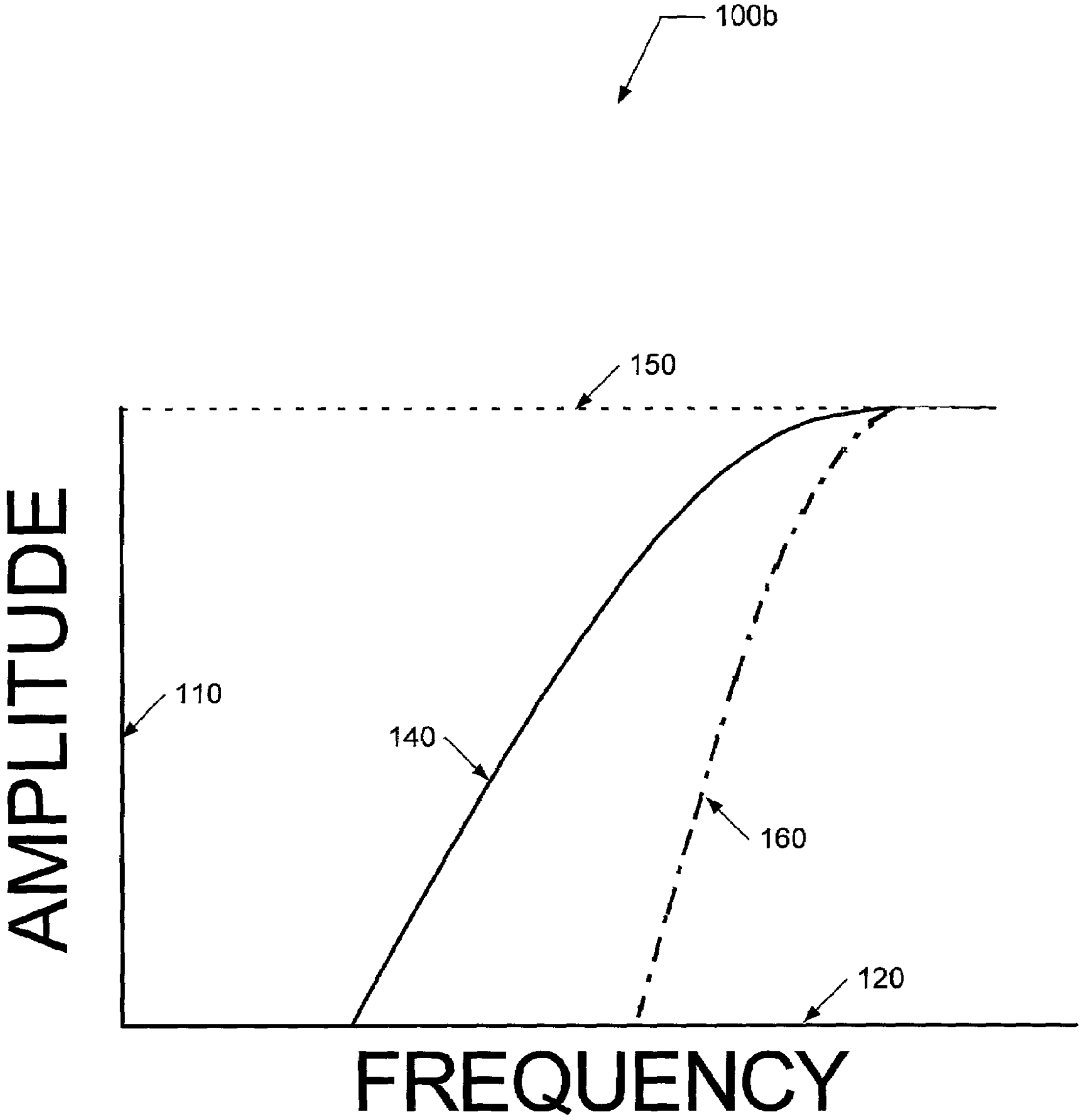
FIG. 1B is a frequency response plot showing a desired response of a main speaker and an actual combined crossover-speaker response.

FIG. 1B is a plot 100*b* comparing an ideal main speaker response 140 and an actual crossover-speaker response 160. As mentioned above, it would be desirable to have a main speaker that accurately produces the high-frequency response 140 of the uniform input signal 150. However, in reality, the main speaker typically does not have a uniform frequency response over the range near or below the crossover frequency 105 (FIG. 1A). Thus, the high-frequency response of the input signal 150, when passed through the crossover and main speakers, produces a non-ideal crossover-speaker response 160 that has different characteristics from that of the ideal high-frequency response 140.

Figure 1C:
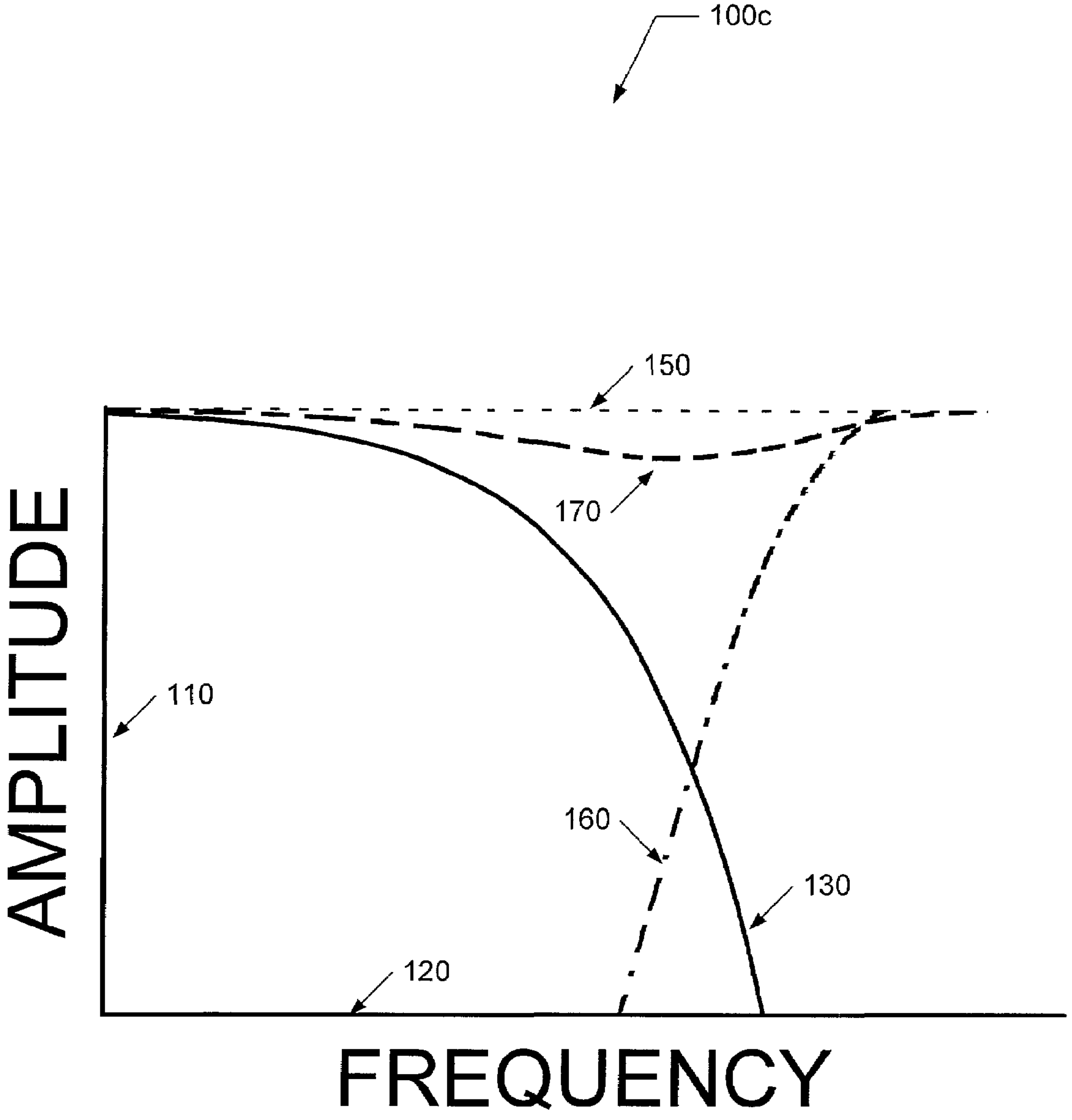
FIG. 1C is a frequency response plot showing an actual response of a combined crossover-speaker and a subwoofer.

FIG. 1C is an actual frequency response plot 100*c* of the actual combined response 170 of a non-ideal crossover-speaker response 160 and a subwoofer response 130. Since the actual crossover-speaker response 160 has different frequency characteristics than the ideal response 140 (FIG. 1A), the combination of the actual crossover-speaker response 160 and the low-frequency response 130 produces a non-uniform frequency response 170 that deviates from the ideal combined sonic output 150. This deviation from the ideal sonic output produces an undesirable blending of sounds.

Figure 1D:
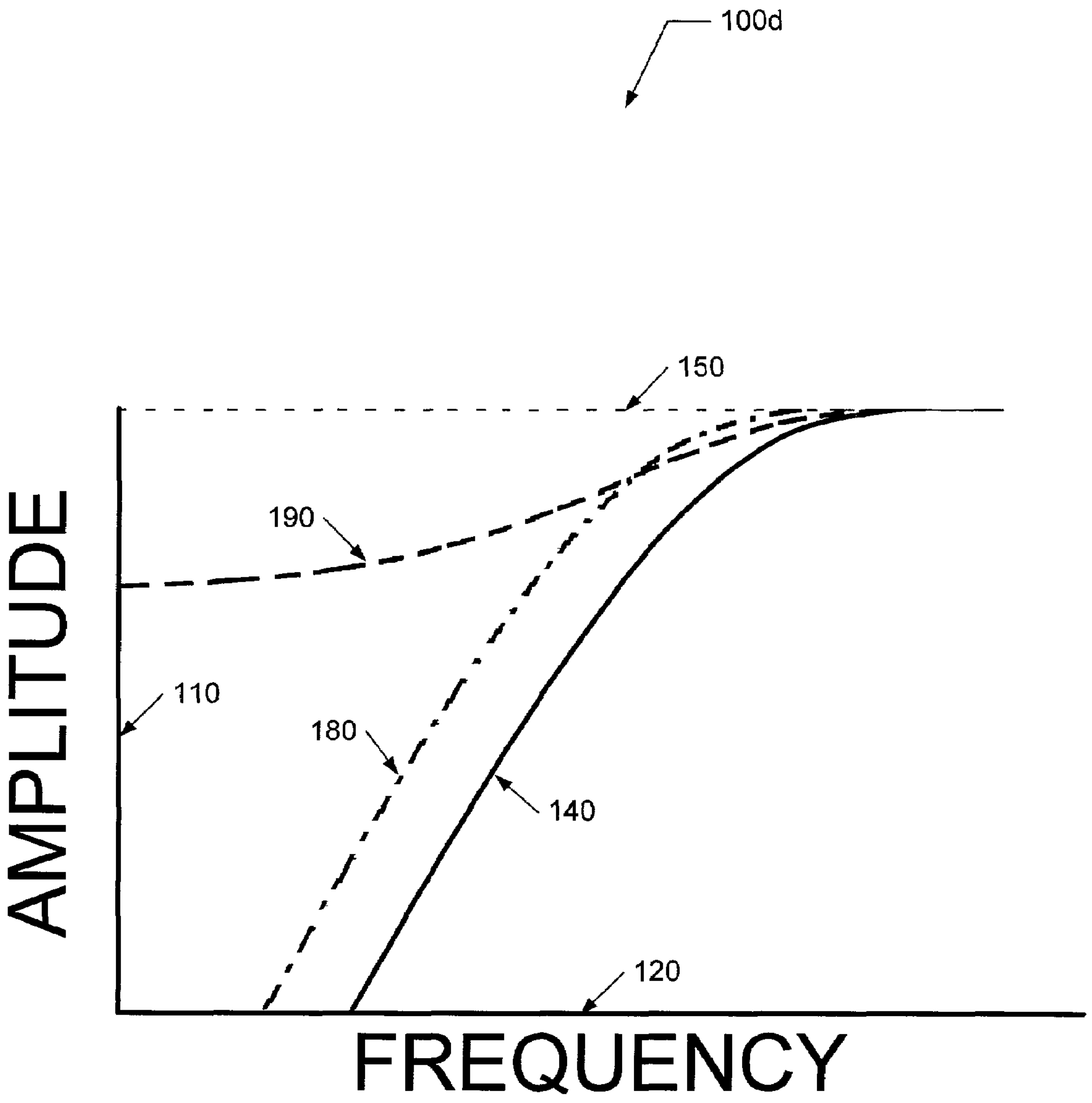
FIG. 1D is a frequency response plot showing a response of a compensation circuit to achieve the desired speaker response from the actual speaker response.

In order to compensate for the undesirable blending of sounds, it is possible to generate a desired high-frequency signal, which, when channeled through the main speaker, would produce a blending of sound. FIG. 1D shows a crossover high-pass response 190 that can be combined with the actual speaker response 180 to produce the desired high-pass speaker response 140. If the response of the main speaker is known, it may be used to generate a high-pass crossover system response 190 that, when combined with the actual response of the main speaker, will produce the desired response 140.

The present invention provides a system and method for generating a high-frequency response from a crossover system to produce a desired speaker response 140. The details of the invention, discussed below, are not to be taken in a limiting sense but are made merely for the purpose of describing the general principles of the invention. The scope of the invention should be ascertained with reference to the issued claims.

Figure 2:
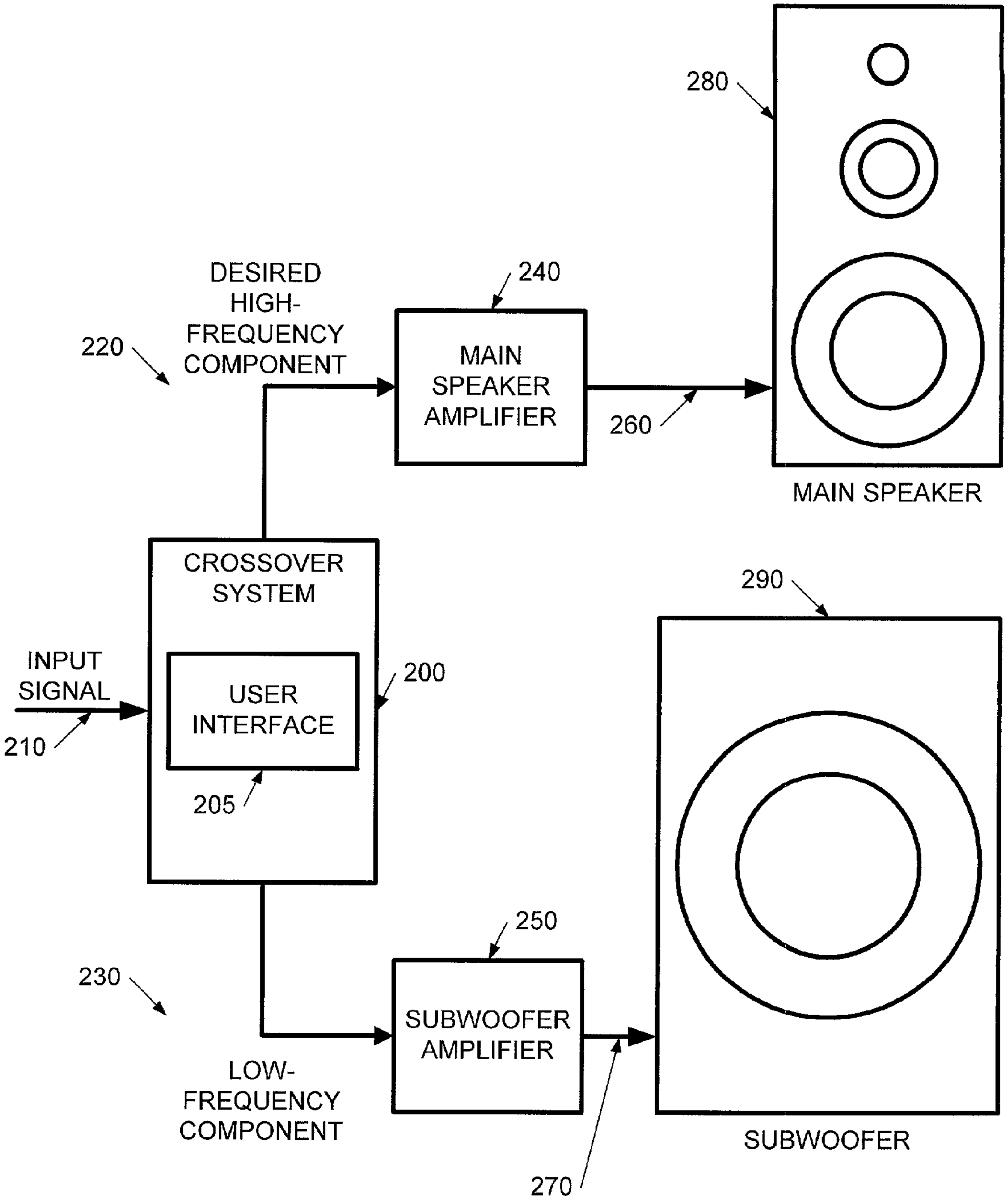
FIG. 2 is a simplified block diagram showing a crossover system in relation to components of a typical audio system.

Crossover System for Pre-Adjusting a High-Frequency Component of an Input Signal to Produce a Desired High-Frequency Sonic Output Turning now to the system of the invention, FIG. 2 shows a high-level diagram of a speaker system constructed in accordance with the invention. The speaker system includes the crossover system 200 of the invention designed to compensate for the frequency response of a main speaker 280 (i.e., to implement the compensation technique discussed above). The crossover system 200 comprises a user interface 205 that allows a user to input various parameters related to the main speaker 280. These parameters reflect the degree of adjustment needed to compensate for non-ideal frequency response characteristics of the main speaker 280 as described in FIGS. 1A–1D. The crossover system 200 receives an input signal 210 and separates the input signal 210 into a high-frequency component 220 and a low-frequency component 230. This high-pass signal 220 is sent to a main speaker amplifier 240, which amplifies the pre-adjusted high-pass signal 220 to produce an amplified high-pass signal 260. The amplified high-pass signal 260 is then sent to a main speaker 280 for the production of high-frequency sounds. The low-frequency component 230 is cascaded through a subwoofer amplifier 250 configured to amplify the low frequency component 230, and the resulting amplified low-pass signal 270 is then sent to a subwoofer 290 configured to produce the low-frequency sounds. The high-pass signal 220 produced by the crossover system 200 takes into account the non-ideal frequency response 180 (FIG. 1D) of the main speaker 280. Hence, the blending of the subwoofer's sonic output with the main speaker's sonic output produces the desired combined sonic output.

Although the crossover system 200 is shown as a separate component, the crossover system 200 may be integrated with other components of the speaker system. For example, the crossover system 200 and subwoofer amplifier 250 may be integrated into a single unit or, alternatively, the crossover system 200 and main speaker amplifier 240 may be integrated into a single unit. Moreover, although the current embodiment shows both high- and low-frequency outputs from the crossover system 200, it will be clear to one of ordinary skill in the art that the crossover system 200 may be such that only a high-frequency component may be produced by the crossover system. It will also be clear to one of ordinary skill in the art that the inventive nature of the crossover system 200 does not depend on the possible permutations by which the crossover system may be combined with other sound system components.

Figure 3:
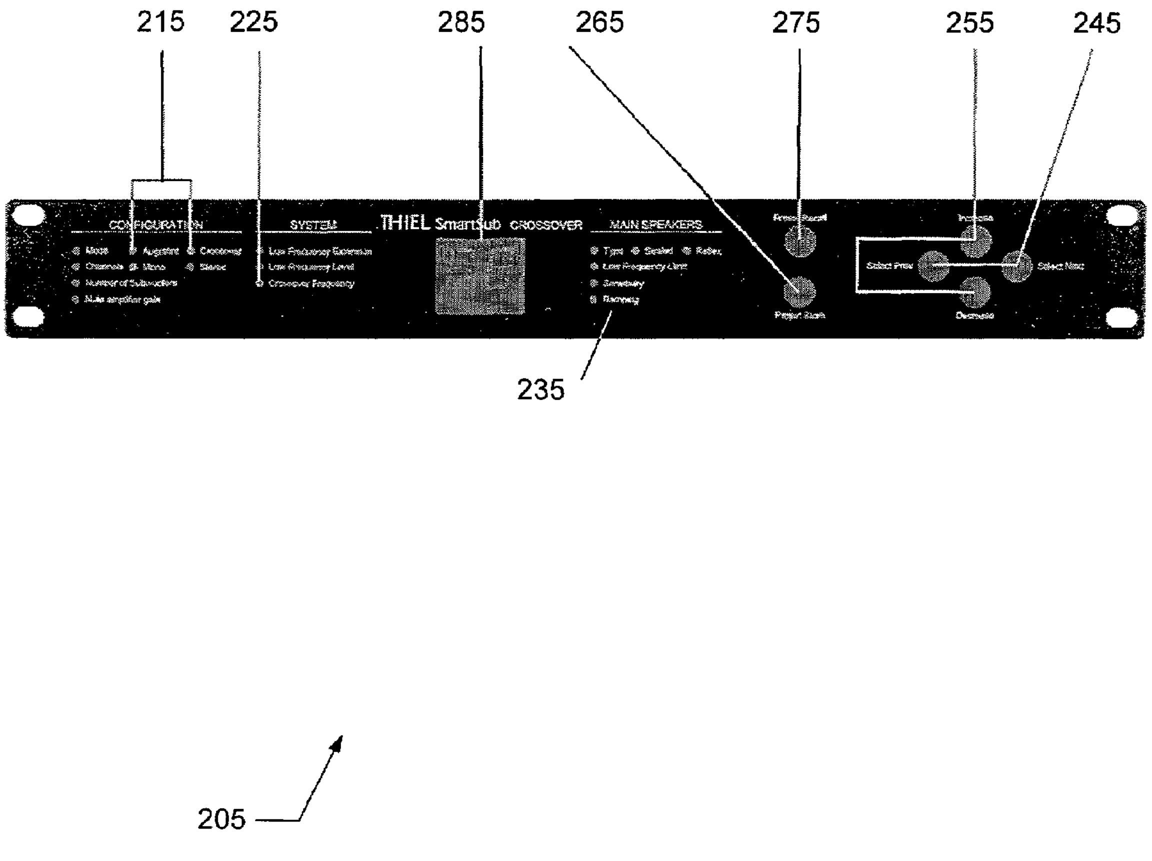
FIG. 3 is a diagram of a front panel of the preferred crossover system.

FIG. 3 shows a front panel, or user interface 205, of a crossover system 200 (FIG. 2) in the sound system of FIG. 2. The user interface 205 allows the user to control many parameters associated with the sound reproduction system such as configuration parameters 215, system parameters 225, or main speaker characteristics 235. The configuration parameters 215 typically include mode (e.g., augment or crossover), channel (e.g., stereo or mono), number of subwoofers, and main amplifier gain. System parameters 225 may include low frequency extension, low frequency level, and crossover frequency. Main speaker characteristics 235 may include type (e.g., sealed or reflex), low frequency limit, sensitivity, and damping factor. These parameters are adjusted using selection buttons 245 configured to select the parameter to be adjusted, and adjust buttons 255 configured to adjust those selected features. A display 285 on the user interface 205 apprises the user of the changing parameters. Once the system parameters are set using the selection buttons 245 and the adjust buttons 255, the user may store the parameters using a store button 265. Alternatively, once certain parameters have been stored, the user may recall the stored parameters using a recall button 275.

Although several parameters and options are shown in the example user interface 205, it will be clear to one of ordinary skill in the art that the user interface 205 may be more or less complex depending on the options available for such a system. For purposes of this discussion, the parameters of interest are configuration mode (specifically, crossover mode), the crossover frequency from the system parameters 225, and the main speaker characteristics 235. Upon selection of crossover mode (configuration parameter 215) and crossover frequency (system parameter 225), the user may enter main speaker characteristics 235 (e.g., type, low frequency limit, sensitivity, and damping factor) related to known characteristics of the main speaker 280 (FIG. 2). Responsive to the user's input of the main speaker characteristics 235, the crossover system 200 adjusts the high-frequency response of the crossover system 200 (FIG. 2) so that the crossover 200 (FIG. 2) produces a high-pass signal 220 (FIG. 2) that, when cascaded through the main speaker amplifier 240 (FIG. 2) and the main speaker 280 (FIG. 2), produces a response that, when combined with the subwoofer response, produces an ideal combined response (i.e., a desirable blending of sound). Although the front panel (or user interface) is shown in the present embodiment as having configuration parameters, system parameters, and main speaker characteristics, it will be clear to one of ordinary skill in the art that additional user options may be implemented through the user interface. These user options may include, but are not limited to, acoustics of the room, temperature, number of speakers, etc. Similarly, it will be clear to one of ordinary skill in the art that several options may be removed from the user interface in order to reduce the complexity of the system for the user. Although only certain options are shown in the user interface, it is not intended to limit the invention to only those options. On the contrary, the intent is to cover all alternatives, modifications, and equivalents included within the spirit and scope of the invention as defined by the appended claims.

Figure 4A:
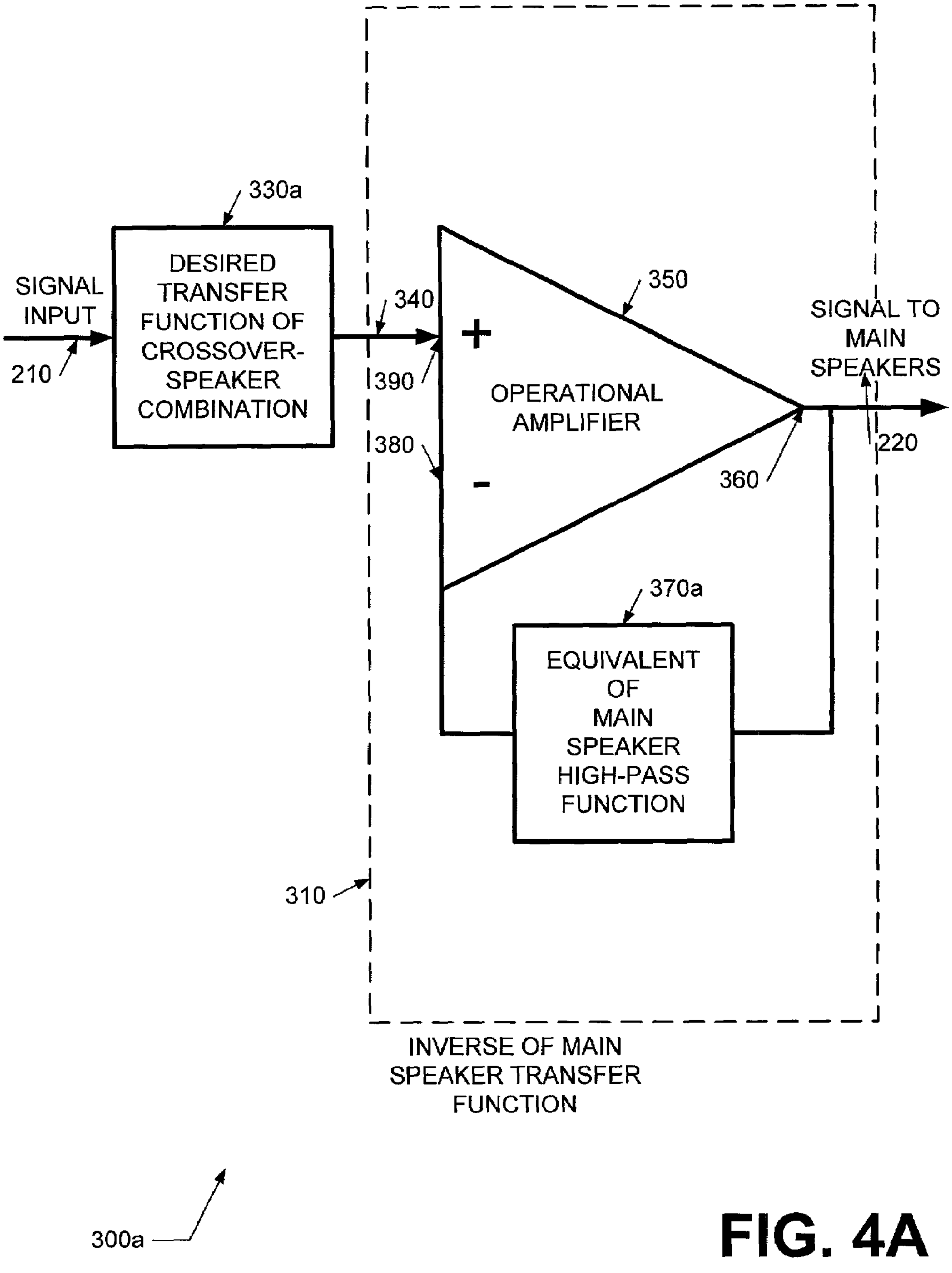
FIG. 4A is a block diagram showing a simplified architecture of the invention having a desired transfer function and a known speaker transfer function.

Turning now to the details of the system for generating the high-frequency response according to the user inputs, FIG. 4A shows a compensation circuit 300*a* that produces the high-pass signal 220 (FIG. 2). An input signal 210 is passed through a desired transfer function circuit 330*a* configured to produce a desired system signal 340 having the characteristics of the desired crossover-speaker response 140 (FIG. 1D). The desired system signal 340, therefore, possesses characteristics of the desired response which, when combined with the low-frequency response, produces the desired combined response. The desired system signal 340 having the desired response is then passed through an inverse transfer function circuit 310 configured to produce the high-pass signal 220. The inverse transfer function circuit 310 comprises a negative-feedback operational amplifier 350 having an equivalent circuit 370*a* in the feedback loop. The equivalent circuit 370*a* is configured to mimic the main speaker 280 (FIG. 2) and produce a response equivalent to the actual speaker response 180 (FIG. 1D). Hence, when a signal passes through the equivalent circuit 370*a*, that response will be as if the signal had passed through the main speaker 280 (FIG. 2). Thus, since the operational amplifier 350 is configured as a negative feedback amplifier, the resulting desired high-pass signal 220 will have frequency response characteristics that anticipate the actual speaker response 180 (FIG. 1D). Therefore, the high-pass signal 220, when channeled through the main speaker 280 (FIG. 2), will produce a sonic output having the high-frequency response which, in turn, will produce the desired blending of sound.

To elaborate on the configuration of the compensation system 300*a*, the inverse transfer function circuit 310 comprises an operational amplifier 350 configured to receive the desired system signal 340 at the positive input node 390 of the operational amplifier 350. The equivalent circuit 370*a* (having an equivalent frequency response as that of the main speaker 280 (FIG. 2)) bridges the output node 360 of the operational amplifier 350 with the negative input node 380 of the operational amplifier 350, thus, comprising the feedback loop.

The compensation circuit 300*a* of this invention can be best demonstrated by using a specific example. FIGS. 4B, 5A, 5B, 6A, 6B, and 6C provide the specific example illustrating the construction and operation of the compensation circuit 300*a* illustrated in FIG. 4A. This example is not provided to limit the invention to the specific details but, rather, to more clearly illustrate the operation of certain aspects of the invention.

The system of FIG. 4A shows two components of the compensation circuit 300*a*: (1) a desired transfer function circuit 330*a*, and (2) an equivalent circuit 370*a*. The equivalent circuit 370*a* may be characterized by its characteristic frequency (also know as the −3 dB point or the cutoff frequency), the damping factors (or Q-factors), and external factors such as the type of woofer enclosure (e.g., sealed or reflex type). Although other factors may be used to characterize the system, the following example uses the characteristic frequency (F) and the damping factor (Q) associated with a sealed-woofer type main-speaker system.

Figure 4B:
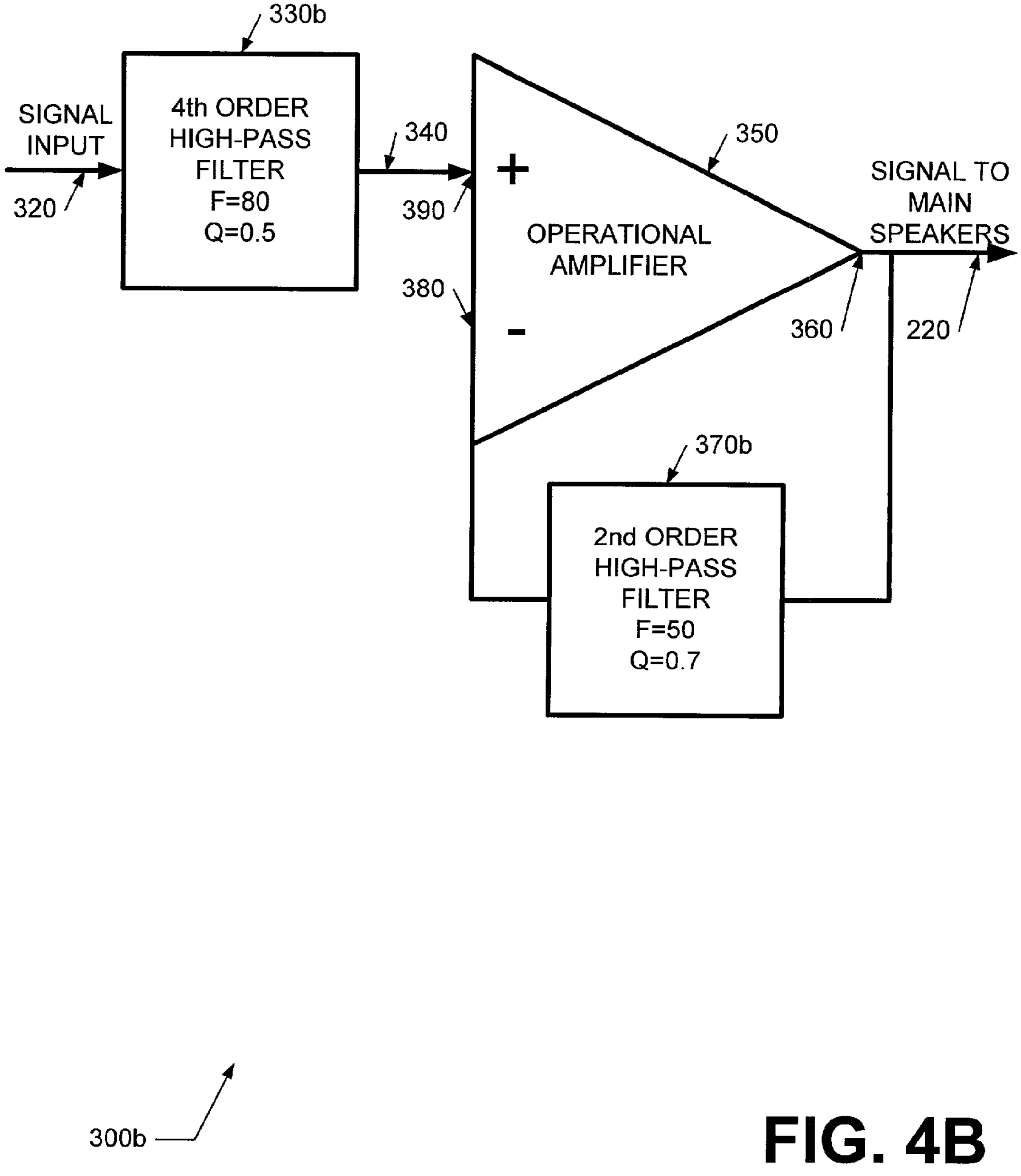
FIG. 4B is a block diagram showing an example system of FIG. 4A having a $4^{th}$-order high-pass system as the desired transfer function and a $2^{nd}$-order high-pass system as the speaker transfer function.

FIG. 4B is a specific example of the compensation circuit 300*a* of FIG. 4A. Once the desired transfer function and the main speaker characteristics are known, these variables are used to create the compensation circuit 300*a* (FIG. 4A) configured to pre-adjust the high-pass input. In this specific example, the user sets the crossover frequency to 80 Hz, hence, making the high-pass characteristic frequency 80 Hz. Furthermore, the desired transfer function 330*a* (FIG. 4A) of the crossover-speaker combination is a $4^{th}$-order high-pass filter 330*b* with a desired characteristic frequency of 80 Hz and a Q-factor of 0.5. Also, if the main speaker uses a sealed woofer type main speaker system with a characteristic frequency of 50 Hz and a Q-factor of 0.7, a $2^{nd}$-order high-pass filter 370*b* with a characteristic frequency of 50 Hz and a Q-factor of 0.7 is used as the equivalent circuit 370*a* (FIG. 4A). Upon configuring the frequency of the $4^{th}$-order high-pass desired transfer function 330*a* (FIG. 4A) to filter 330*b* and the equivalent circuit 370*a* (FIG. 4A) to the $2^{nd}$-order high-pass filter 370*b* in response to the user inputs, the system is ready to produce the desired high-pass signal 220 from the input signal 320. The input signal 320 is passed through the $4^{th}$-order high-pass filter 330*b*, which produces the desired system signal 340 of the crossover-speaker combination. The desired system signal 340, when passed through the operational amplifier 350, having a $2^{nd}$-order high-pass filter 370*b* in the negative feedback loop, is effectively multiplied by the inverse function of the main speaker. The signal produced by multiplying the inverse of the main speaker to the desired system signal 340 is the desired high-frequency signal 220 that is eventually supplied to the main speaker amplifier 240 (FIG. 2) and, subsequently, to the main speaker 280 (FIG. 2). Although this specific example uses a specific $4^{th}$-order high-pass filter 330*b* to demonstrate the desired transfer function circuit 330*a* and a specific $2^{nd}$-order high-pass filter 370*b* to demonstrate the equivalent circuit 370*a*, it will be clear to one of ordinary skill in the art that these two circuits may be substituted with different types of circuits depending on the different speaker and crossover system responses.

Figure 5A:
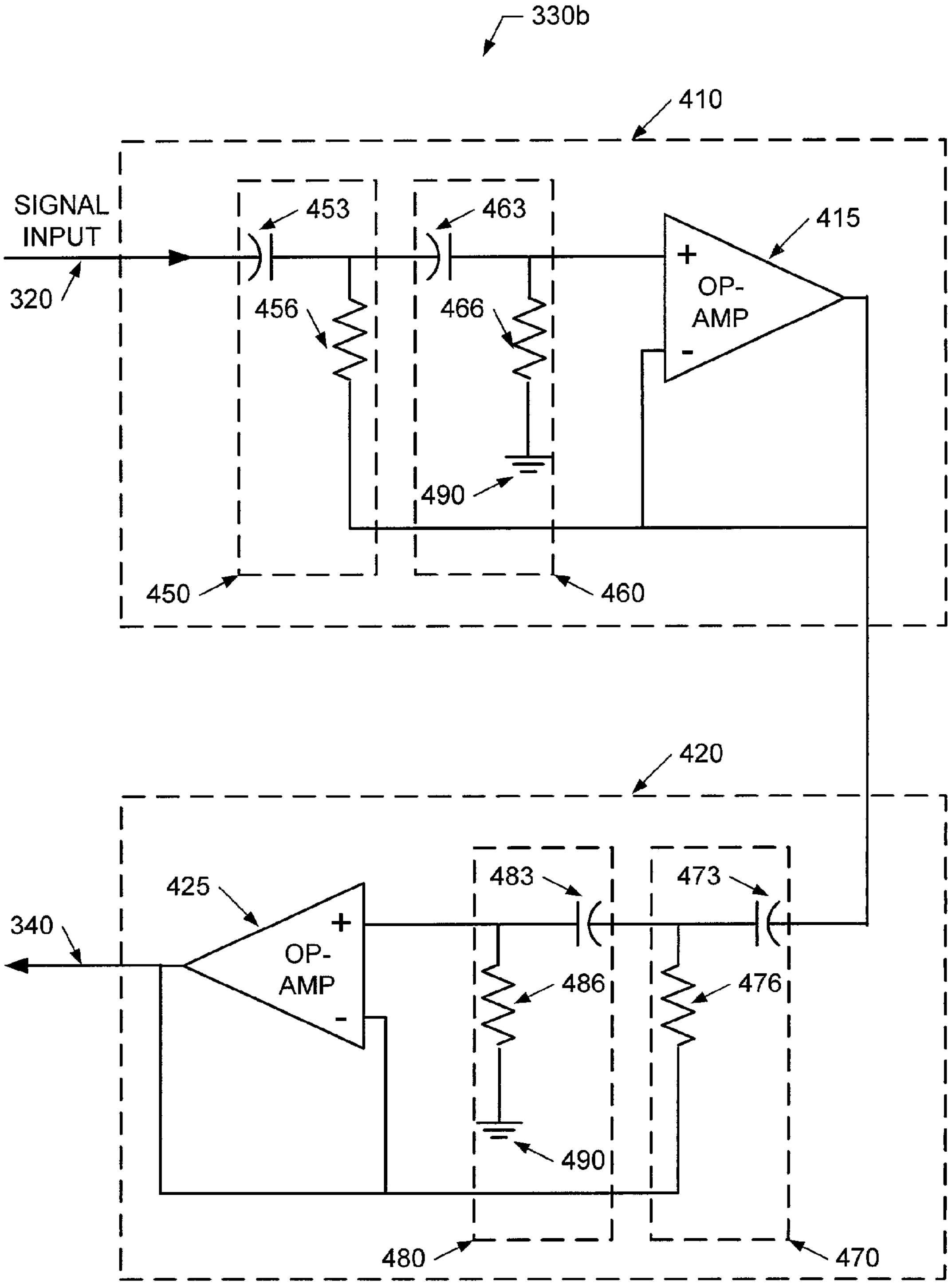
FIG. 5A is a circuit diagram showing the $4^{th}$-order high-pass system of FIG. 4B.
Figure 5B:
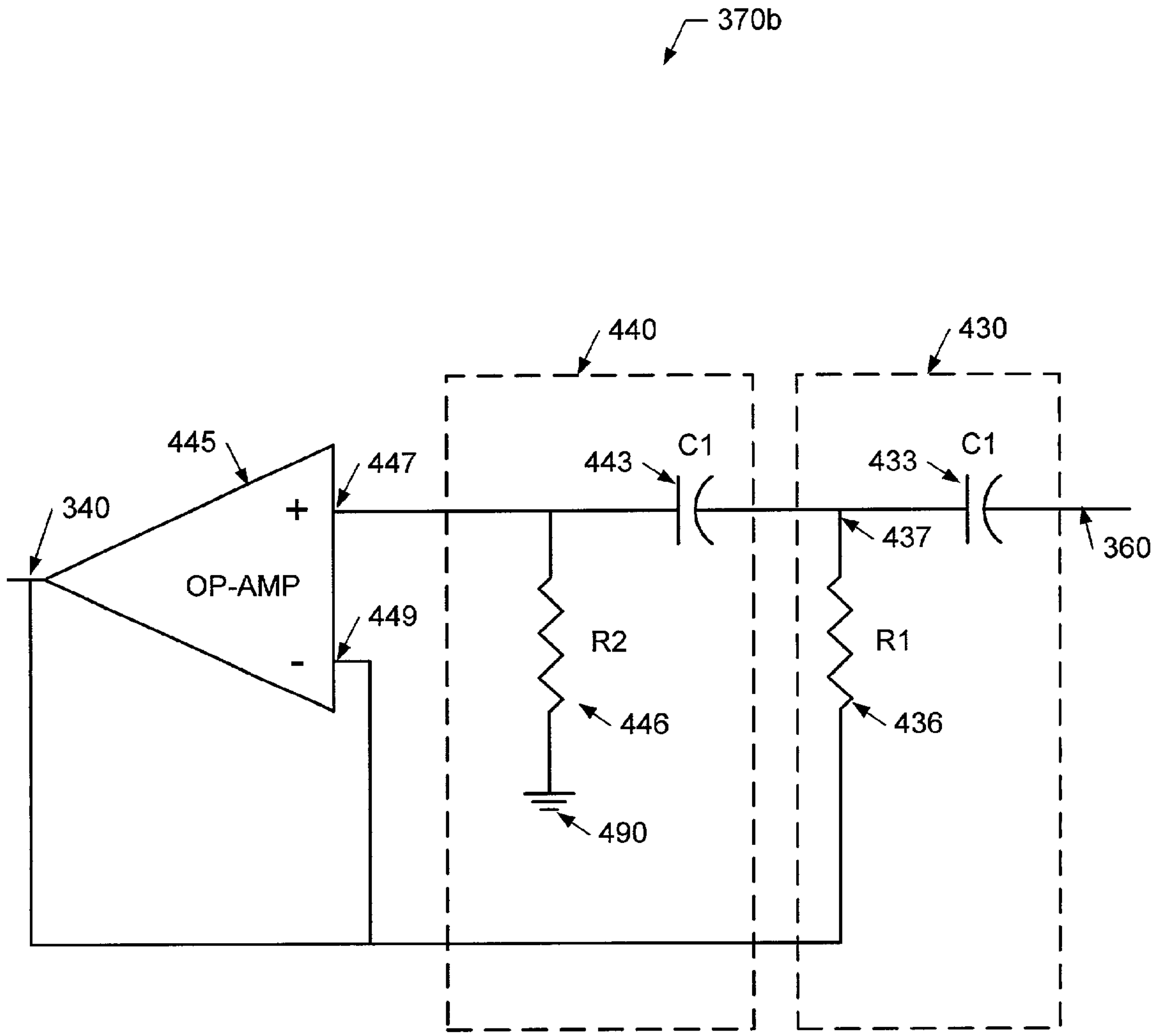
FIG. 5B is a circuit diagram showing the $2^{nd}$-order high-pass system of FIG. 4B.

Given the example circuit of FIG. 4B, FIGS. 5A and 5B illustrate a possible circuit for realizing the specific $4^{th}$-order high-pass filter 330*b* and the specific $2^{nd}$-order high-pass filter 370*b*.

FIG. 5A shows the $4^{th}$-order high-pass filter 330*b* of FIG. 4B. The $4^{th}$-order high-pass filter 330*b* comprises four resistor-capacitor (RC) circuits 450, 460, 470, 480 and two operational amplifiers 415, 425 that are configured as two serially-cascaded $2^{nd}$-order high-pass filters 410, 420. Both the $2^{nd}$-order high-pass filters 410, 420 comprise two serially connected RC circuits 450, 460, 470, 480 that are responsible for producing the high-pass characteristics of the desired system signal 340.

FIG. 5B shows the $2^{nd}$-order high-pass filter 370*b* of FIG. 4B. The example $2^{nd}$-order high-pass filter 370*b* comprises two RC circuits 430, 440 serially connected to the input of the operational amplifier 445 to produce the desired $2^{nd}$-order characteristics. If identical capacitors 433, 443 are used in each of the RC circuits 430, 440, and the capacitor value and resistor values are $C_1$, $R_1$, and $R_2$, respectively, then the characteristic frequency, F, and the Q-factor, Q, are given by Eq. 1 and Eq. 2, respectively:

$$F = \frac{1}{2\pi C_1\sqrt{R_1R_2}} \qquad \text{[Eq. 1]}$$

$$Q = \frac{\sqrt{\frac{R_2}{R_1}}}{2} \qquad \text{[Eq. 2]}$$

Thus, determining the values of $R_1$ (436 of FIG. 5B) and $R_2$ (446 of FIG. 5B) in terms of F and Q gives:

$$R_1 = \frac{1}{4\pi C_1FQ} \qquad \text{[Eq. 3]}$$

$$R_2 = \frac{Q}{\pi FC_1} \qquad \text{[Eq. 4]}$$

A convenient way to achieve adjustable values of $R_1$ (436 of FIG. 5B) and $R_2$ (446 of FIG. 5B) is to realize them with voltage controlled equivalent resistances. This is shown in FIGS. 6A, 6B, and 6C.

Figure 6A:
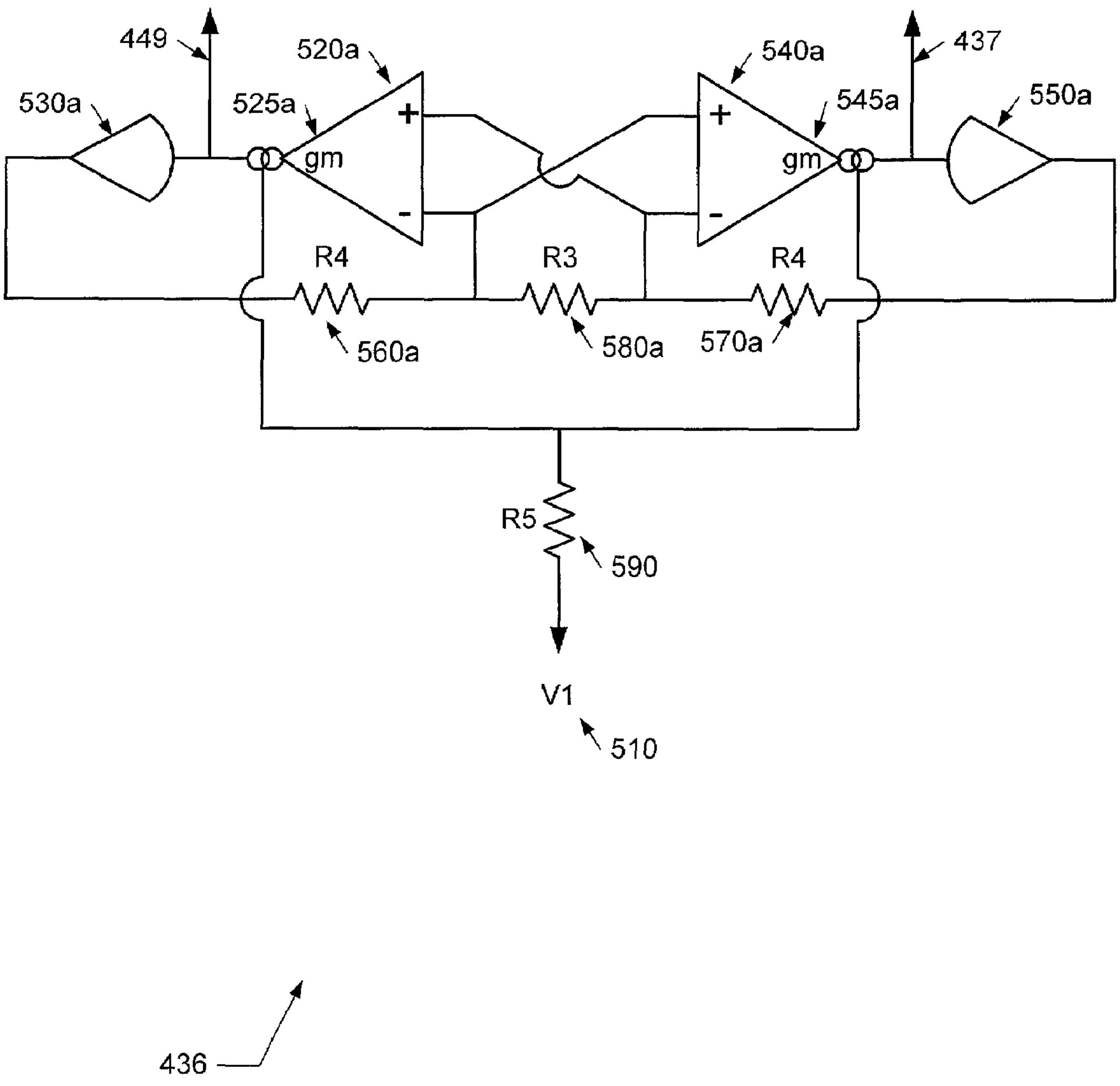
FIG. 6A is a circuit diagram showing an equivalent-resistance circuit that can be used for the first resistance in FIG. 5B.
Figure 6B:
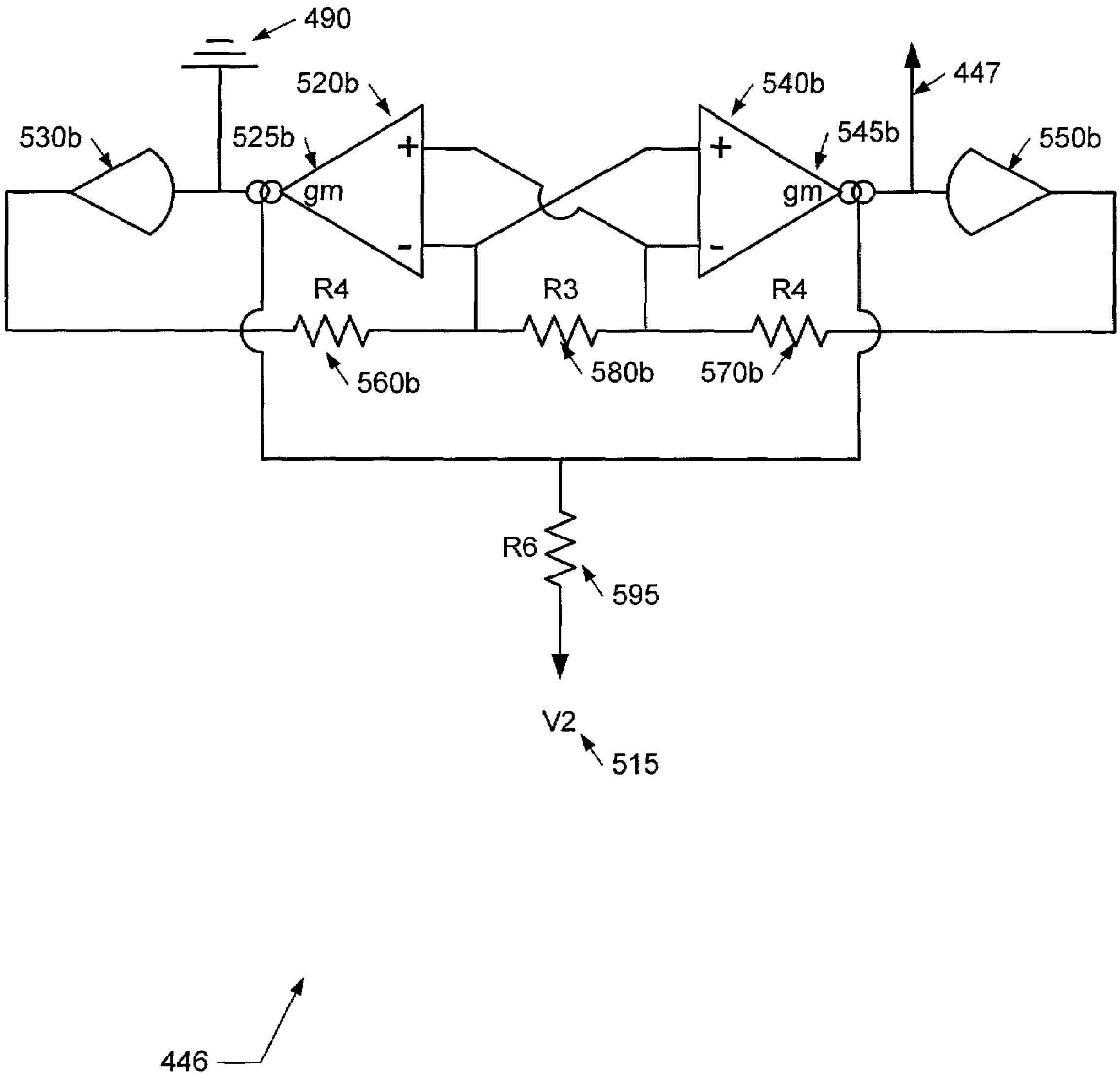
FIG. 6B is a circuit diagram showing an equivalent-resistance circuit that can be used for the second resistance in FIG. 5B.
Figure 6C:
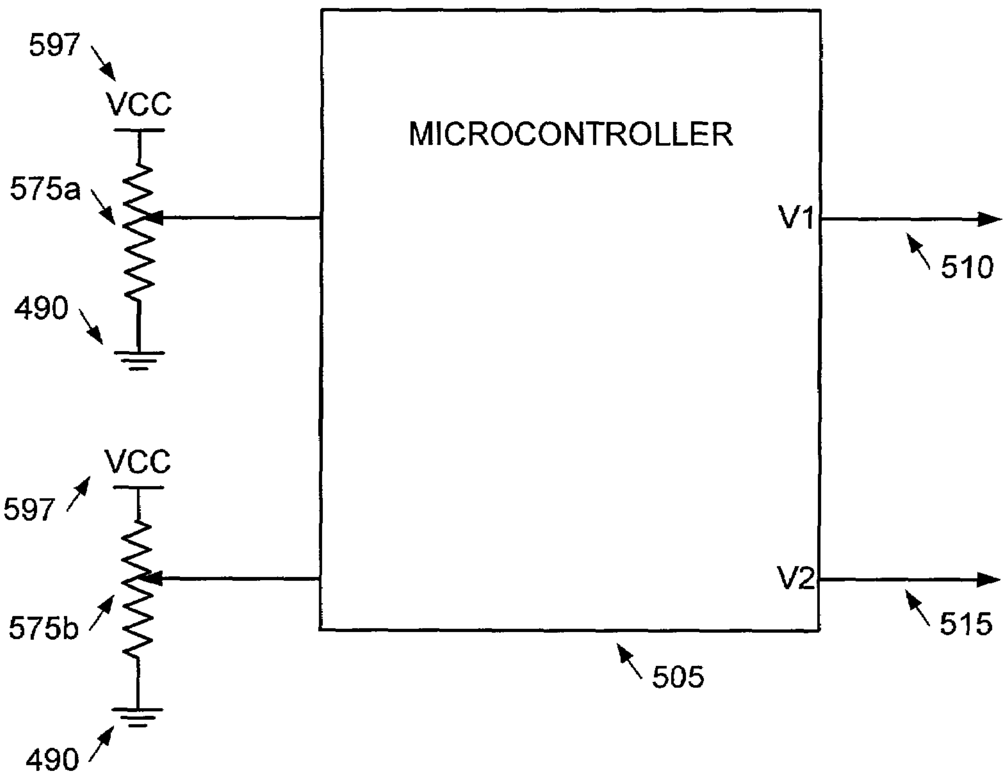
FIG. 6C is a block diagram showing a microcontroller circuit for providing a control voltage to the equivalent resistances of FIGS. 5A and 5B.

FIGS. 6A and 6B show the resistors $R_1$ (436, FIGS. 4B and 5A) and $R_2$ (446, FIGS. 4B and 5B) as voltage-controlled equivalent resistances, each implemented with two operational transconductance amplifiers 520*a*, 540*a*, 520*b*, 540*b*. Details on the operation of transconductance amplifiers are well known and understood by persons skilled in the art, and need not be described herein. Given the circuit configurations of FIGS. 6A and 6B, the resistances $R_1$ and $R_2$ are represented by:

$$R_1 = \frac{2R_4R_5}{gmR_3V_1} \qquad \text{[Eq. 5]}$$

$$R_2 = \frac{2R_4R_6}{gmR_3V_2} \qquad \text{[Eq. 6]}$$

where $V_1$ and $V_2$ are the control voltages and gm is the transconductance per current through the resistors $R_5$ (590 of FIG. 6A) and $R_6$ (595 of FIG. 6B). Thus, the required voltages $V_1$ and $V_2$, in terms of F and Q, are:

$$V_1 = \frac{8R_4R_5\pi C_1FQ}{gmR_3} \qquad \text{[Eq. 7]}$$

$$V_2 = \frac{2R_4R_6\pi C_1F}{gmR_3Q} \qquad \text{[Eq. 8]}$$

FIG. 6C shows a microcontroller 505 that may be used in conjunction with the equivalent resistance circuits of FIGS. 6A and 6B. In practice, it is convenient to use a microcontroller 505 to perform the calculations so that user-adjustable controls for F and Q can supply voltages to the microcontroller 505, and the microcontroller 505 will supply outputs $V_1$ 510 and $V_2$ 515 according to Eqs. 7 and 8, respectively. Since the structure and operation of microcontrollers are well known in the art, these devices will not be discussed further. It is sufficient to say that careful adjustment of voltages $V_1$ (510 of FIGS. 6A and 6C) and $V_2$ (515 of FIGS. 6B and 6C) produces the desired resistances $R_1$ (436 of FIGS. 5B and 6A) and $R_2$ (446 of FIGS. 5B and 6B), which, in turn, are used to construct the $2^{nd}$ order high-pass filter circuit 370*b* (FIGS. 4B and 5B), which is the inverse transfer function circuit 310 (FIG. 4A) used to produce the pre-adjusted high-frequency signal 220.

Figure 7A:
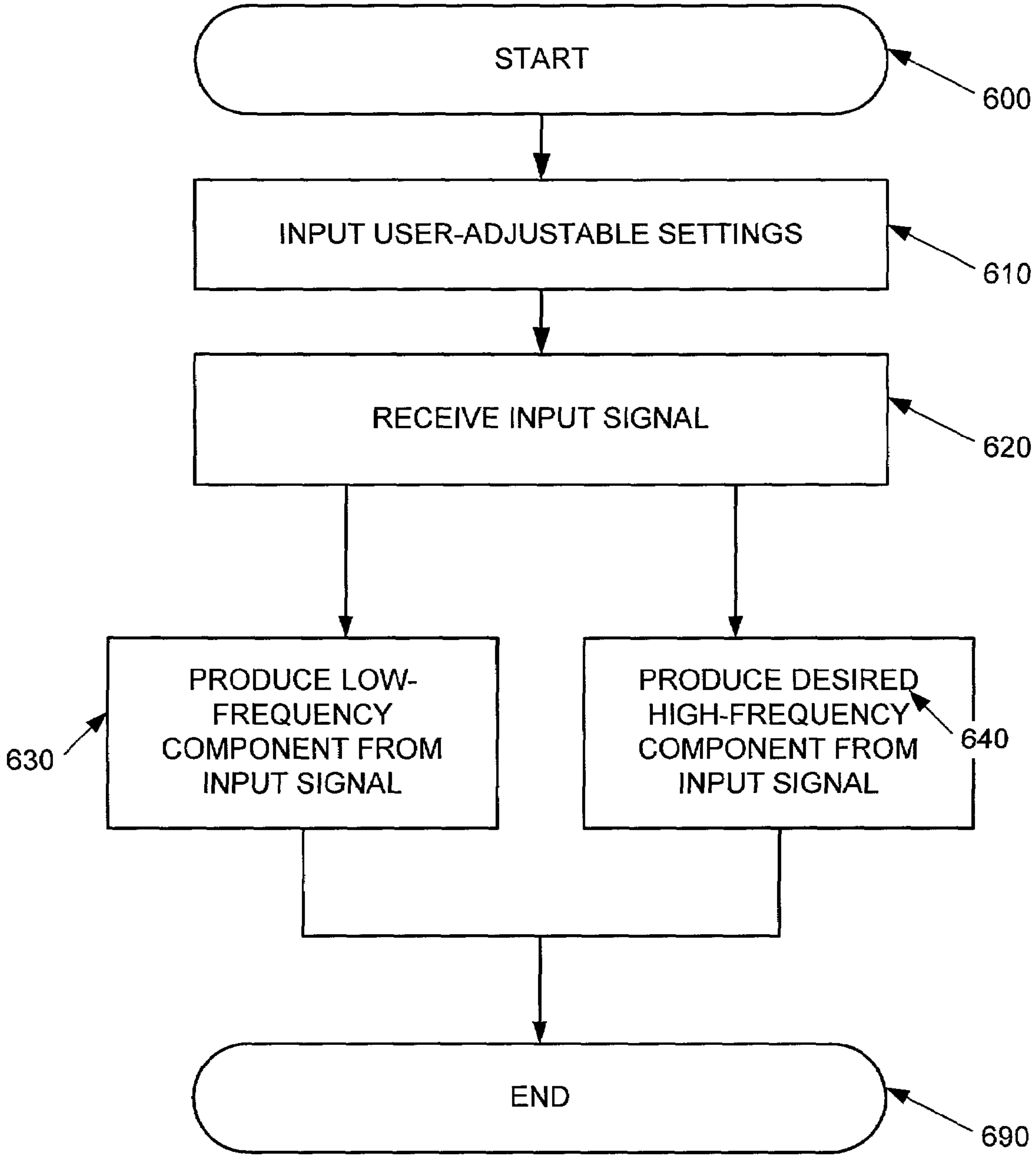
FIG. 7A is a flow chart showing the operation of the crossover system of FIG. 4A.

FIG. 7A shows the operation of the invention described above. In step 610, the user inputs user-adjustable settings into the crossover system. The system receives, in step 620, an input signal. This input signal is then used to produce, in step 630, a low-frequency component of the input signal, and contemporaneously, in step 640, a desired high-frequency component of the input signal. Although the present embodiment of the invention is configured to produce both a low-frequency component (step 630) and a desired high-frequency component (step 640), the crossover system may be configured to produce only the high-frequency component.

Figure 7B:
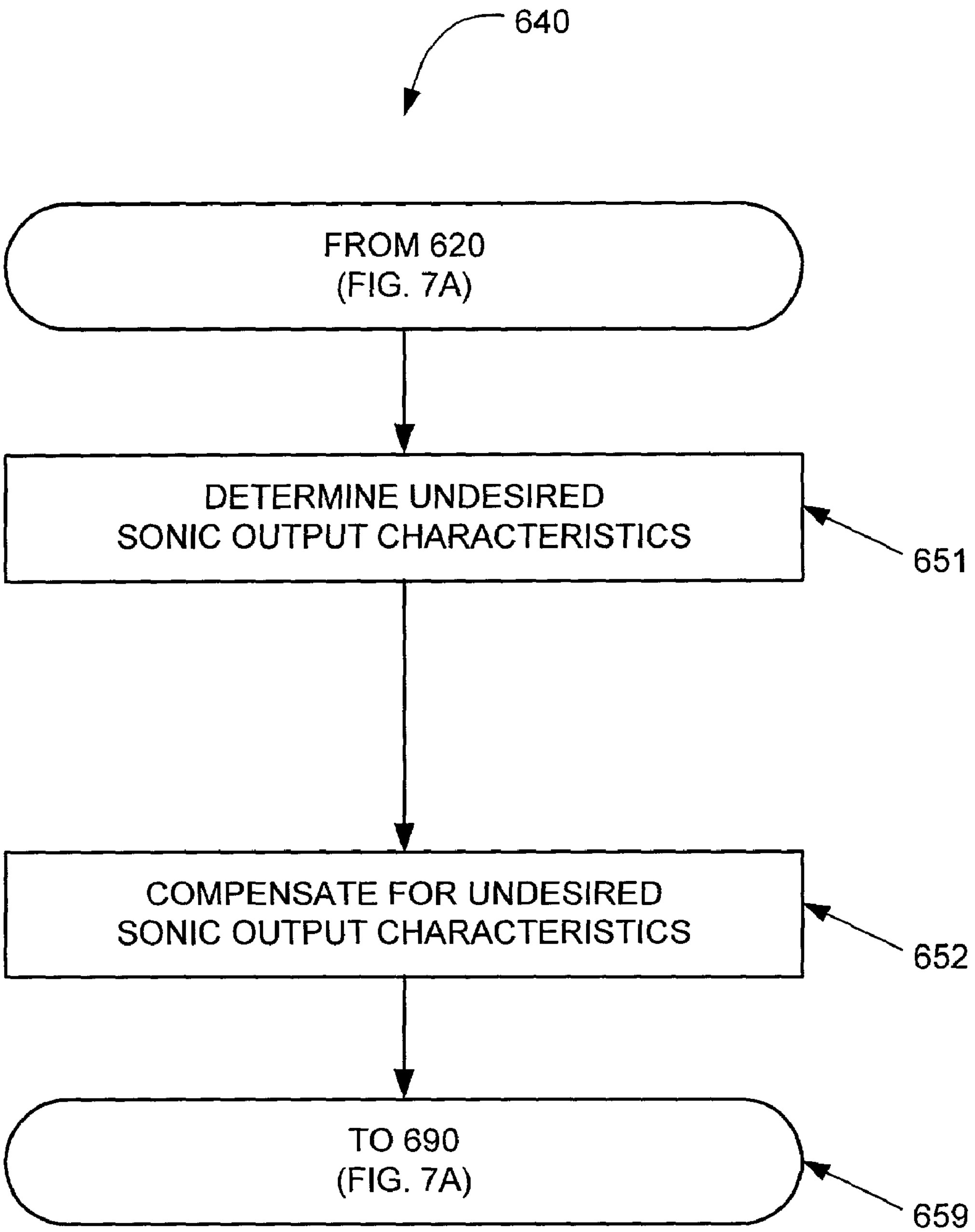
FIG. 7B is a flow chart showing the modification of the high-frequency component of FIG. 7A to produce a pre-adjusted high-pass signal.

FIG. 7B shows the process of producing the desired high-frequency component 640 in more detail. Once the user-adjustable settings have been entered 610 (FIG. 7A) and the signal has been received 620 (FIG. 7A), the crossover, in step 651 determines the undesired sonic output characteristics of the main speaker from the user adjustable settings and, in step 652, compensates for the undesired sonic output characteristics by producing the desired frequency response characteristics which compensates for the undesired characteristics. Thus, the sound that is eventually produced from the main speaker will better complement the sound produced from the subwoofer.

Figure 7C:
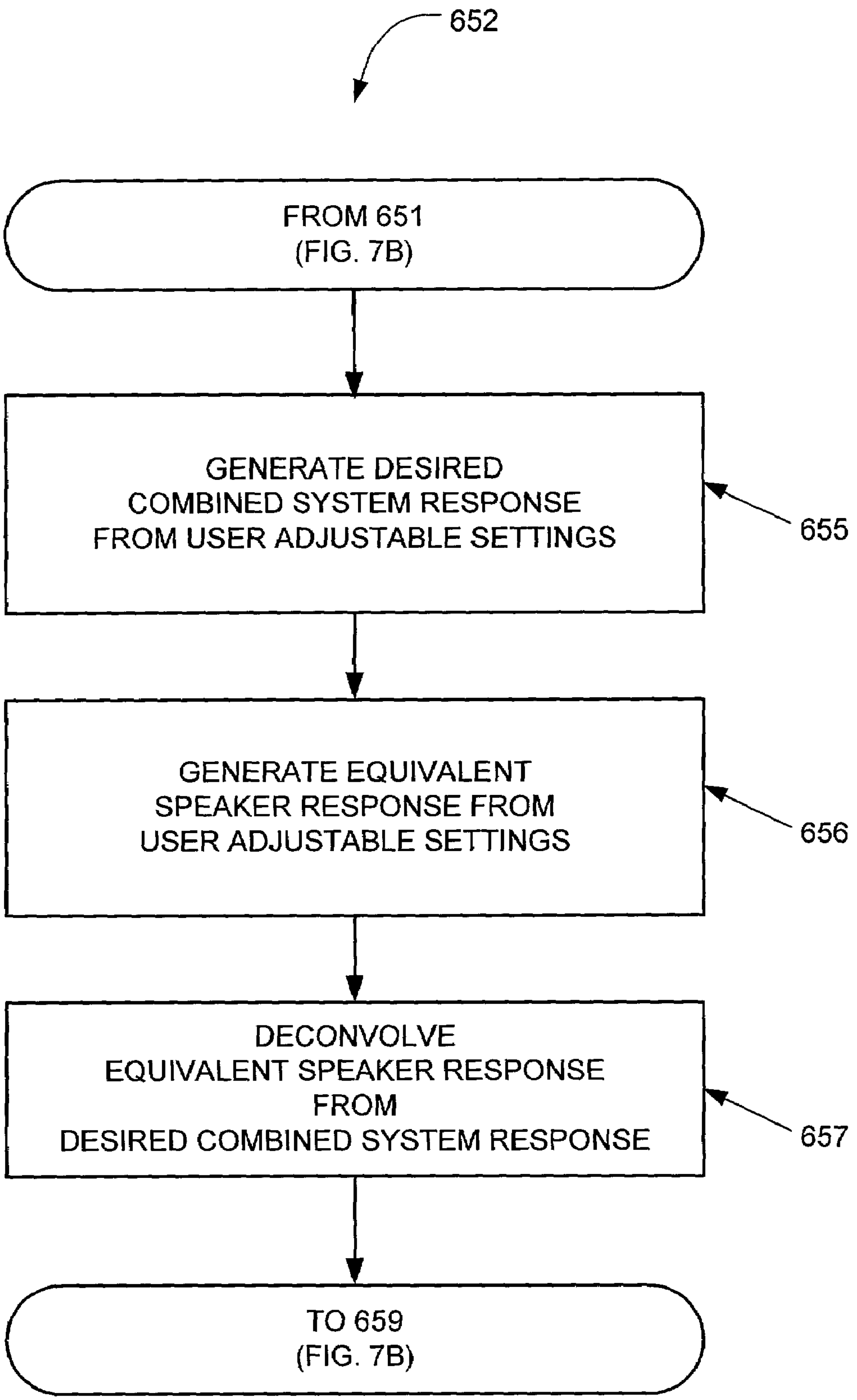
FIG. 7C is a flow chart showing, in greater detail, the method of compensating for the undesired sonic output of FIG. 7B.

FIG. 7C shows, in greater detail, the method of compensating for the undesired sonic output 652 (FIG. 7B). The crossover generates, in step 655, a desired system response that is reflective of the desired crossover and main speaker combination (i.e., the desired combined system response) from the user adjustable settings. In addition to the desired combined system response, the crossover generates, in step 656, an equivalent speaker response, which is reflective of the main speaker response, from the user adjustable settings. The equivalent speaker response is then deconvolved, in step 657, from the desired combined system response to produce the compensation circuit, which compensates for the undesired main speaker characteristics. The compensation circuit produces the desired high-frequency component from the input signal.

Although an exemplary embodiment of the present invention has been shown and described, it will be apparent to those of ordinary skill in the art that a number of changes, modifications, or alterations to the invention as described may be made, none of which depart from the spirit of the present invention. For example, the crossover system and the amplifiers may be integrated into a signal unit, the order of the filters ($2^{nd}$- or $4^{th}$-order) do may be adjusted depending on the response of the actual system components, the low-frequency response may be removed from the crossover output, the method steps may be rearranged, etc. All such changes, modifications, and alterations should therefore be seen as within the scope of the present invention.

I claim:

1. An apparatus for adjusting the frequency response of a speaker system, the apparatus comprising: a user interface configured to receive user-adjustable variables indicative of main speaker low frequency characteristics; and a compensation circuit configured to produce a desired high-pass signal from an input, the compensation circuit comprising:

a desired transfer function circuit having frequency response characteristics analogous to a desired crossover-main speaker combination;

an equivalent circuit having frequency response characteristics analogous to a main speaker; and a deconvolution circuit configured to deconvolve the main speaker characteristics from the desired crossover-main speaker combination characteristics.

2. The apparatus of claim 1, wherein the user-adjustable variable comprises at least one variable selected from the group consisting of:

a main speaker low frequency cutoff frequency;

a main speaker low frequency damping factor;

a speaker sensitivity factor;

a speaker enclosure type; and a gain factor.

3. A crossover system for adjusting the frequency response of a speaker system, the crossover system comprising:

a user interface configured to directly receive user-adjustable variables from a user, the user-adjustable variables being indicative of main speaker low frequency characteristics, wherein the user-adjustable variables comprise at least one variable selected from the group consisting of: a main speaker low frequency cutoff frequency, a main speaker low frequency damping factor, a speaker sensitivity factor, and speaker enclosure type; and a compensation circuit configured to produce a desired high-pass signal from an input signal in response to the user-adjustable variables.

4. A crossover system for adjusting the frequency response of a speaker system, the crossover system comprising:

a user interface configured to directly receive user-adjustable variables from a user, the user-adjustable variables being indicative of main speaker low frequency characteristics; and a compensation circuit configured to produce a desired high-pass signal from an input signal in response to the user-adjustable variables, wherein the compensation circuit further comprises:

a desired transfer function circuit having frequency response characteristics analogous to a desired crossover-main speaker combination;

an equivalent circuit having frequency response characteristics analogous to a main speaker; and a deconvolution circuit configured to deconvolve the main speaker characteristics from the desired crossover-main speaker combination characteristics.

5. A method for adjusting the frequency response of a speaker system, the method comprising the steps of:

directly receiving user-adjustable settings from a user, the user-adjustable settings being indicative of main speaker low frequency characteristics; and producing desired frequency response characteristics in response to the user adjustable settings, wherein the producing step further comprises the steps of:

generating a combined system response from the user adjustable settings, the combined system response having frequency response characteristics of a desired combined system;

generating an equivalent speaker response from the user adjustable settings, the equivalent speaker response having frequency response characteristics of the main speaker; and deconvolving the equivalent speaker response from the combined speaker response to produce a compensated response.

* * * * *